(12) United States Patent
Hsieh

(10) Patent No.: US 6,893,917 B2
(45) Date of Patent: May 17, 2005

(54) STRUCTURE AND FABRICATING METHOD TO MAKE A CELL WITH MULTI-SELF-ALIGNMENT IN SPLIT GATE FLASH

(75) Inventor: Chia-Ta Hsieh, Tainan (TW)

(73) Assignee: Taiwan Semiconductor Manufacturing Company, Hsinchu (TW)

( * ) Notice: Subject to any disclaimer, the term of this patent is extended or adjusted under 35 U.S.C. 154(b) by 0 days.

(21) Appl. No.: 10/178,384

(22) Filed: Jun. 24, 2002

(65) Prior Publication Data

US 2004/0169246 A1 Sep. 2, 2004

(51) Int. Cl.[7] .............................................. H01L 21/336
(52) U.S. Cl. ...................................................... 438/257
(58) Field of Search ................................ 438/257–267, 438/FOR 203; 257/314–320, E21.179, E21.422, E21.68, E21.683, E21.686, E21.678, E21.688

(56) References Cited

U.S. PATENT DOCUMENTS 6,204,126 B1    3/2001  Hsieh et al. ................. 438/267
6,229,176 B1    5/2001  Hsieh et al. ................. 257/316
6,242,308 B1    6/2001  Hsieh et al. ................. 438/265
6,259,131 B1    7/2001  Sung et al. .................. 257/315
6,593,187 B1 *  7/2003  Hsieh .......................... 438/257
6,610,570 B2 *  8/2003  Chen ........................... 438/257

* cited by examiner

Primary Examiner—George Fourson
Assistant Examiner—Brook Kebede
(74) Attorney, Agent, or Firm—Thomas, Kayden, Horstemeyer & Risley

(57) ABSTRACT

A new structure is disclosed for semiconductor devices with which contact regions are self-aligned to conductive lines. Openings to a gate oxide layer, in partially fabricated devices on a silicon substrate, having insulating sidewalls. First polysilicon lines disposed against the insulating sidewalls extend from below the top of the openings to the gate oxide layer. Oxide layers are grown over the top and exposed sides of the first polysilicon lines serving to insulate the first polysilicon lines. Polysilicon contact regions are disposed directly over and connect to silicon substrate regions through openings in the gate oxide layer and fill the available volume of the openings. Second polysilicon lines connect to the contact regions and are disposed over the oxide layers grown on the first polysilicon lines.

26 Claims, 11 Drawing Sheets

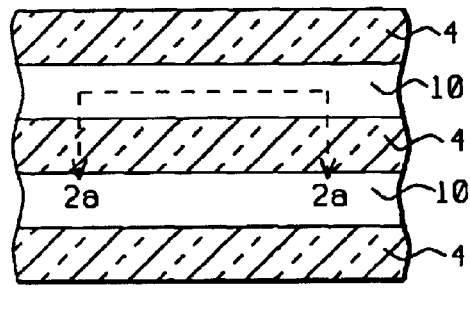
FIG. 1a – Prior Art
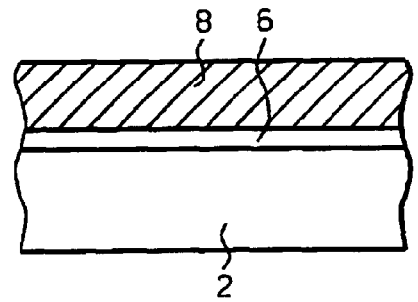
FIG. 2a – Prior Art
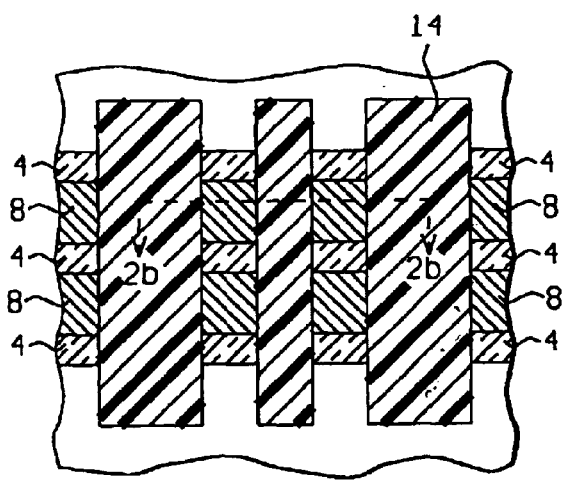
FIG. 1b – Prior Art
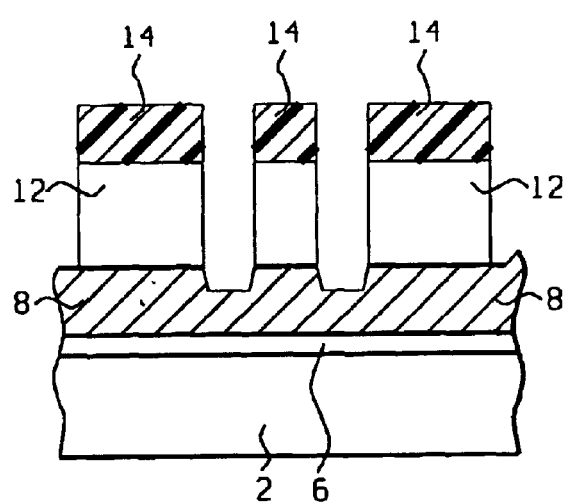
FIG. 2b – Prior Art

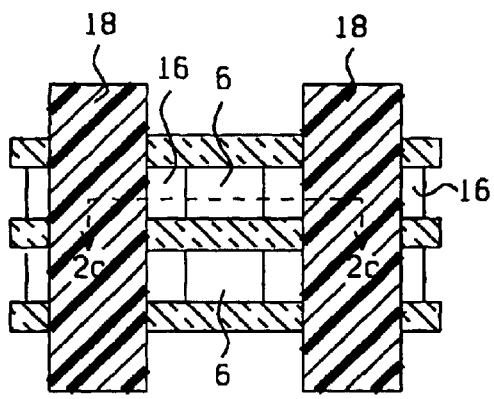
FIG. 1c - Prior Art
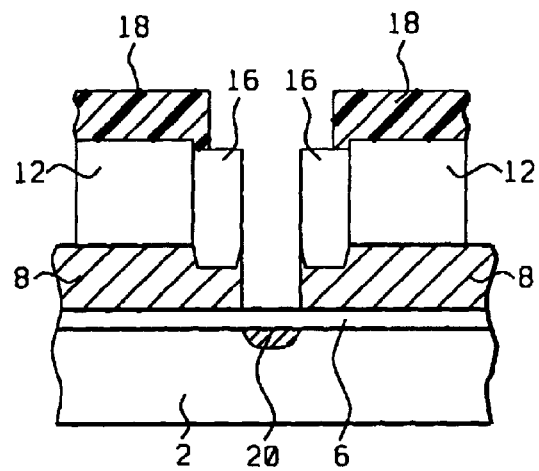
FIG. 2c - Prior Art
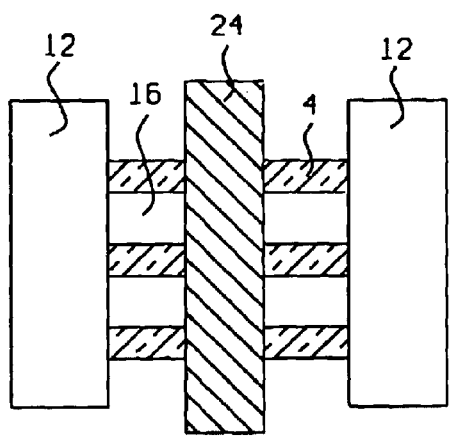
FIG. 1d - Prior Art
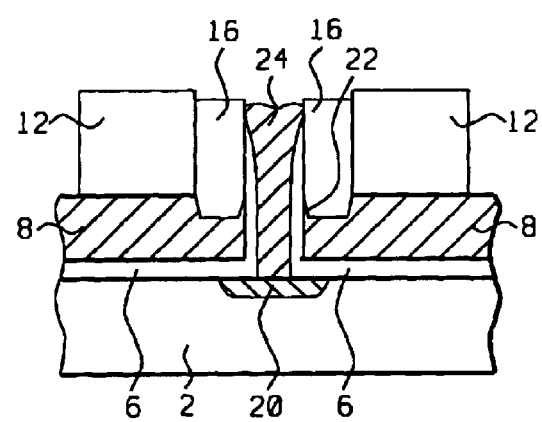
FIG. 2d - Prior Art

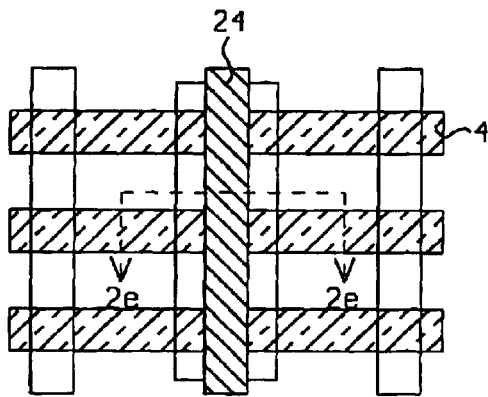
Fig 1e –
Prior Art
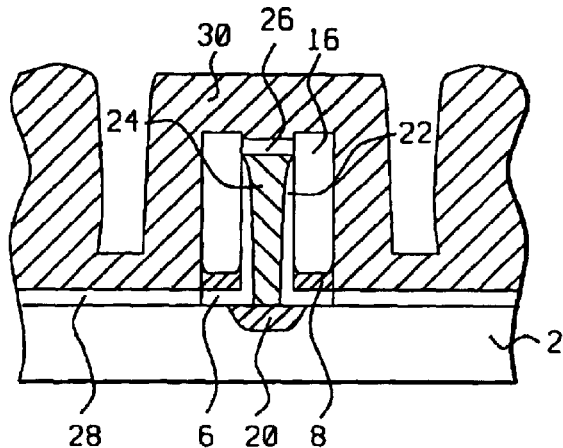
Fig 2e –
Prior Art
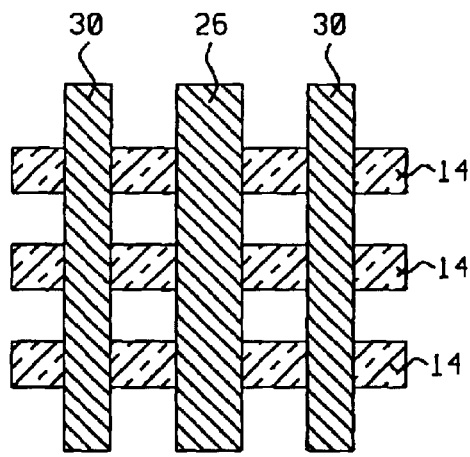
Fig 1f –
Prior Art
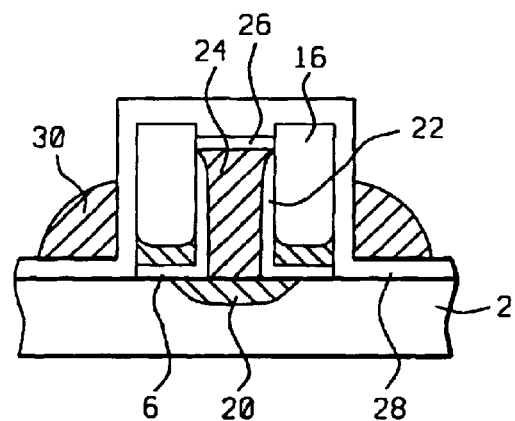
Fig 2f –
Prior Art

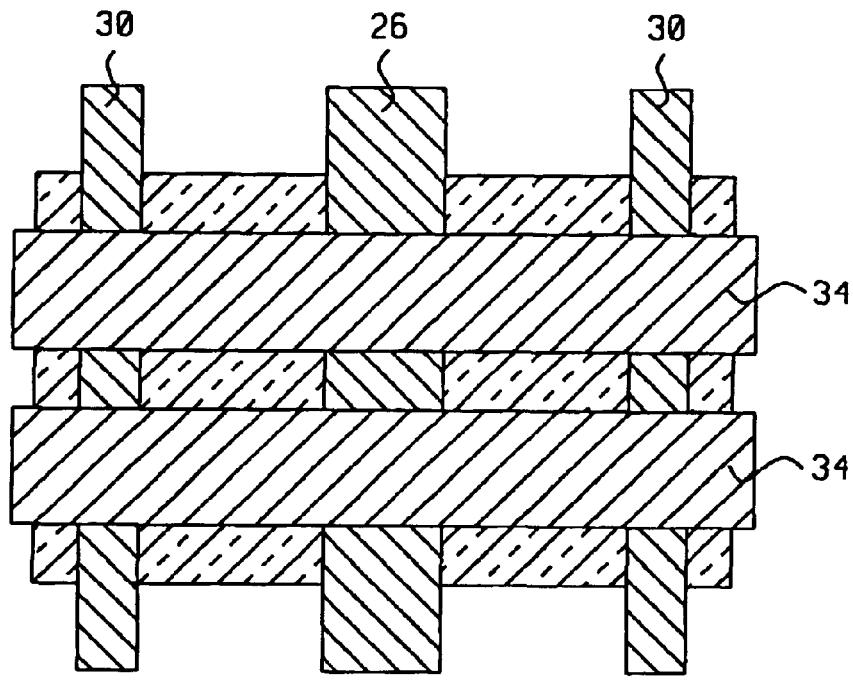
FIG. 1g – Prior Art
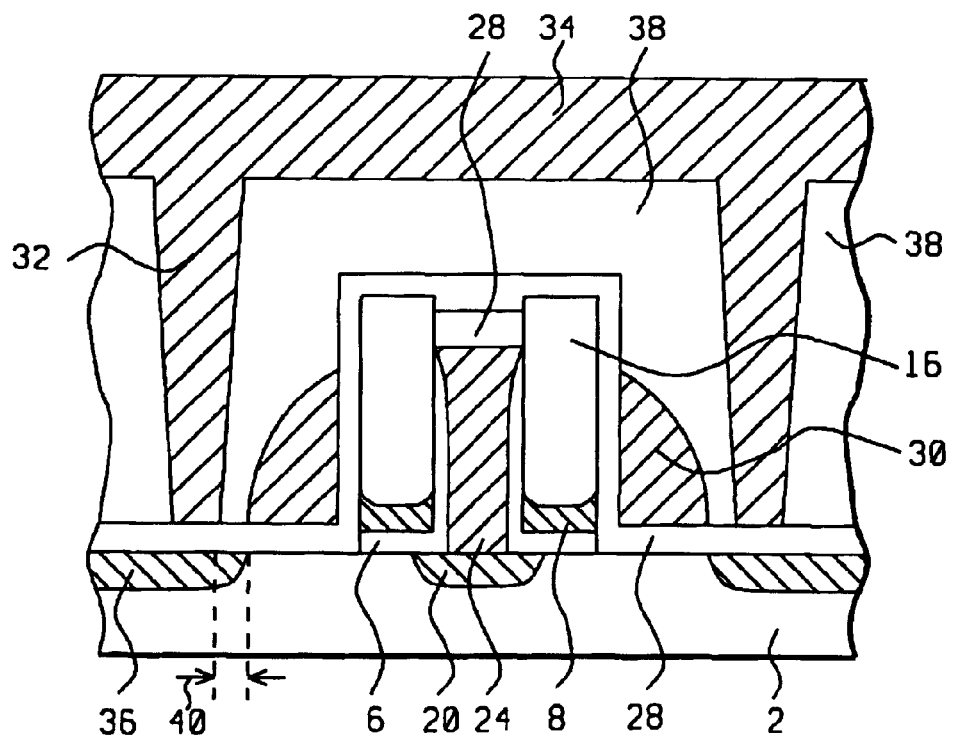
FIG. 2g – Prior Art

STRUCTURE AND FABRICATING METHOD TO MAKE A CELL WITH MULTI-SELF-ALIGNMENT IN SPLIT GATE FLASH

BACKGROUND OF THE INVENTION (1) Field of the Invention

The present invention relates generally to semiconductor integrated circuit technology and more particularly to split gate memory cells used in flash EPROMs (Electrically Erasable Programmable Read Only Memory).

(2) Description of Prior Art

Increased performance in computers is often directly related to a higher level of circuit integration. Tolerances play an important role in the ability to shrink dimensions on a chip. Self-alignment of components in a device serves to reduce tolerances and thus improve the packing density of chips. Other techniques can be important in shrinking device size. A method is disclosed later in the embodiment of the present invention of forming a structure with self-aligned source to floating gate, wordline to floating gate and bitline contact to wordline, which allows for significant reduction in the area of the split gate flash cell.

As is well known in the art, split gate flash cells have bitlines and wordlines and bitline contacts that connect bitlines to drain regions. Bitlines and bitline contacts are traditionally insulated from wordlines by an interleaved dielectric layer. The separation between bitline contacts and wordlines must be maintained large enough so as to avoid possible shorts that could develop between adjacent bitline contacts and wordlines. Bitline contact to wordline separations are determined by the positions of bitline contact openings, which are set by a design rule. In arriving at the design rule the possibility of misalignment must be taken into account, which results in a required separation well beyond that needed to avoid development of shorts. This requirement for increased separation, arising from the need to account for unavoidable misalignment, limits the ability to decrease cell size. Self-alignment of the bitline contact to the wordline, as in the structures disclosed by the present invention, eliminates the reliability issue, allows a reduction cell area and facilitates shrinking the cell size. Furthermore, in the structures disclosed by the present invention there is, in addition to self-aligned bitline contact to wordline, also self-alignment of source to floating gate and wordline to floating gate; allowing a further reduction in cell area and further facilitating shrinking the cells size.

A traditional methods of fabricating a split gate flash memory cell is presented in FIGS. 1a–1g, where top views of the cell are presented at successive stages of the process and in FIGS. 2a–2g, which show the corresponding cross-sections. A floating gate oxide, 6, is formed on a semiconductor substrate 2, which preferably is a silicon substrate, to a thickness of about 80 Angstroms, followed by deposition of a first polysilicon layer, 8, to a depth of about 800 Angstroms. Active regions, 10, are defined using isolating regions, such as shallow trench isolation region, 4. This is followed by deposition of a nitride layer, which preferably is a silicon nitride layer to a depth of about 2500 Angstroms. A photoresist layer, 14, is then formed as shown in FIGS. 1b and 2b. The photoresist pattern, 14, is used in etching the silicon nitride layer to achieve the shape of region 12 of FIG. 2b. A first polysilicon etch is performed to achieve the shape of region 8 as shown in FIG. 2b, where the sloped segments of the first polysilicon layer provide improved operation of the memory cell. Details of the method to fabricate such sharp poly tips are presented in U.S. Pat. No. 6,090,668 to Lin et al., which is herein incorporated by reference. After removal of the photoresist, an second oxide layer, 16, is deposited to a thickness of about 3000 Angstroms and a CMP (chemical-mechanical polishing) step is performed. A second photoresist layer, 18, is formed and used in successively etching the silicon nitride layer and the first polysilicon layer to achieve the structure shown in FIGS. 1c and 2c. Source regions 20 are formed by a P ion implantation at energy of about 20 keV and to a dose of about 4E14 per cm2. Removal of the second photoresist layer is followed by deposition of an third oxide layer to a depth of about 500 Angstroms, which enhances the lateral diffusion of the source implant. An third oxide etching step is performed to achieve third oxide spacers, 22. A polysilicon deposition is performed to a depth of about 3000 Angstroms and a CPM step on this layer produces a second polysilicon region 24, which serves to contact the source 20. At this stage the structure is as depicted in FIGS. 1d and 2d. The traditional method proceeds with oxidation of second polysilicon, 24, to form about 200 Angstroms of fourth oxide, 26. Next the nitride layer 12 is removed, and successive etches are performed of the first polysilicon layer, 8, and floating gate first oxide layer, 6. An fifth oxide layer, 28, is grown to a depth of about 170 Angstroms. After a third polysilicon deposition, 30, to about 2000 Angstroms, the structure is as shown in FIGS. 1e and 2e. Etching the third polysilicon layer, poly spacers, 30, are formed that serve as wordlines. A drain implant is now performed that usually is an As implant at energy about 60 keV and to a dose of about 4E15 per cm2. This forms the drain regions 36. An interlevel dielectric (ILD) layer, 38, is deposited. A photoresist layer is formed and patterned so that upon etching of the IDL layer, contacts are opened to the drain regions. A first metal deposition follows removal of the photoresists layer. Another photoresist layer is formed and patterned so that after etching first metal bitlines 34 are formed connecting to the drain regions, 36 through the first metal contact regions 32. This completes the formation of a traditional split gate flash cell, which is shown in FIGS. 1g and 2g.

Bitlines, 34 and bitline contacts, 32 are insulated from the wordlines, 30 by an interlevel dielectric layer, 38. The minimum separation, 40, is between bitline contacts and wordlines and this separation must be maintained large enough so as to avoid possible shorts that could develop between adjacent bitline contacts and wordlines. Bitline contact to wordline separations are determined by the positions of bitline contact openings relative to wordlines and the dimensions of the openings, which are set by design rules. In arriving at the design rule the possibility of misalignment and variability in the production of contact openings must be taken into account, which results in a required minimum separation well beyond that needed to avoid development of shorts. This requirement for increased separation limits the ability to decrease cell size. Self-alignment of the bitlines contact to the wordline, as in the structures disclosed by the present invention, eliminates the reliability issue, allows a reduction in cell area and facilitates shrinking the cell size.

A split-gate flash memory cell having self-aligned source line and a novel polysilicon gate tip for enhanced F-N tunneling is disclosed in U.S. Pat. No. 6,259,131 to Sung et al. In U.S. Pat. No. 6,204,126 to Hsieh et al. there is disclosed a method for forming a split-gate flash memory cell where the floating gate of the cell is self-aligned to isolation, to source and to wordline. In U.S. Pat. No. 6,242,308 to Hsieh et al. there is disclosed a method for forming a split-gate flash memory cell having a thin floating gate and a sharp polysilicon gate tip to improve the programming and erasing speed of the cell. A method for fabricating a split-gate flash memory cell utilizing step poly to improve cell performance is provided to U.S. Pat. No. 6,229,176 to Hsieh et al.

SUMMARY OF THE INVENTION

It is a primary objective of the invention to provide a split gate flash cell with self-aligned bitline contact to wordline, self aligned wordline to floating gate and self aligned source line to floating gate. It is also a primary objective of the invention to provide a method of forming a split gate flash cell with self-aligned bit contact bitline contact to word line wordline, self aligned word line wordline to floating gate and self aligned source line to floating gate. Furthermore, it is a primary objective of the invention to provide a structure allowing a reduction in cell size, resulting in improved performance and packing density.

A new structure for split gate flash memory devices is disclosed with multi-self alignment. Active regions, arranged in rows, are disposed over a semiconductor region and separated by isolation regions. Split gate memory cells are arranged in identical order along the rows of active regions, each element being composed of four elements: drain, wordline, floating gate and source elements denoted by D, W, F and S respectively, which are arranged as . . . DWFSFWDWFSFD . . . , so that drain elements, which adjoin wordline elements on either side, and source elements, which adjoin floating gate elements on either side, are each shared by two memory cells. Floating gate elements are composed of a gate insulator layer disposed over the semiconductor region, conductive floating gates disposed over the gate insulator layer, an insulator layer disposed over the floating gates, and sidewall insulator layers. Source elements, self aligned to said adjoining floating gate elements, are composed of source regions, contained within the semiconductor region, extending below the adjoining floating gate elements, with conductive source pick up lines disposed over and electrically connected to the source regions and which electrically connect corresponding source regions of all rows, and with a source element insulator layer disposed over the source pick up lines. Wordline elements, self aligned to floating gate elements on one side and drain elements on the other side, are composed of a wordline gate insulator layer disposed over the semiconductor region, with conductive wordline disposed over the wordline gate insulator that connect corresponding wordline elements of all rows, with a wordline insulator layer disposed over the wordlines and with wordline sidewall insulator layers on side walls facing drain regions. Drain elements, self aligned to said adjoining wordline elements, are composed of drain regions, contained within the semiconductor region, with conductive drain pick up lines disposed over and electrically connected to the drain regions and which electrically connect all drain regions for each row.

BRIEF DESCRIPTION OF THE DRAWINGS

In the accompanying drawing forming a material part of this description, there is shown:

FIGS. 1a–1g show top views depicting a traditional method of forming split gate flash memory cells.

FIGS. 2a–2g show cross sectional views depicting a traditional method of forming split gate flash memory cells.

DESCRIPTION OF THE PREFERRED EMBODIMENTS

Figure 3A:
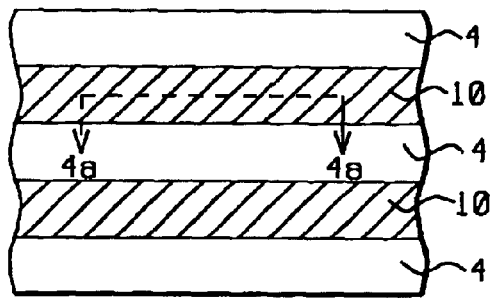
FIGS. 3a–3g show top views depicting a method of forming split gate flash memory cells according to the invention.
Figure 4A:
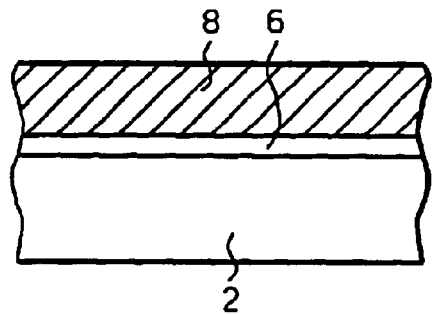
FIGS. 4a–4g show cross sectional views depicting a method of forming split gate flash memory cells according to the invention.
Figure 3B:
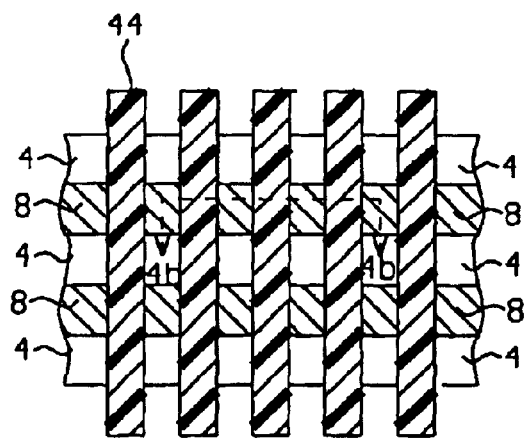
Figure 4B:
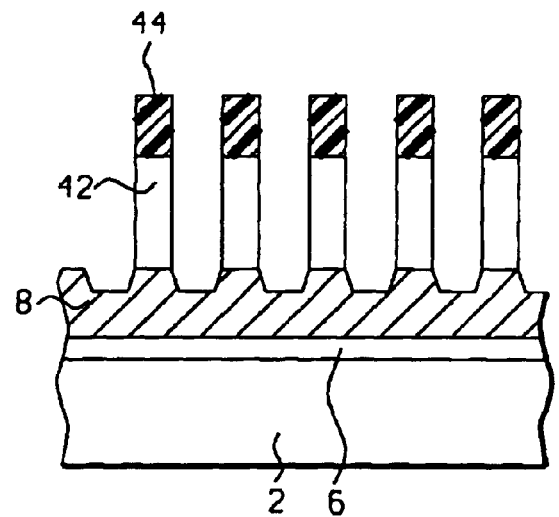
Figure 3C:
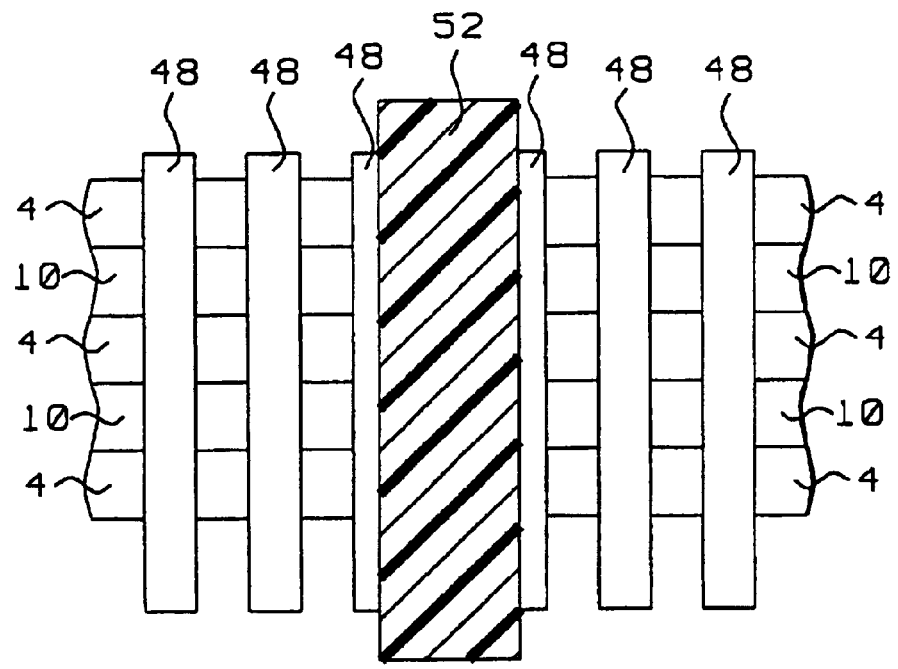
Figure 4C:
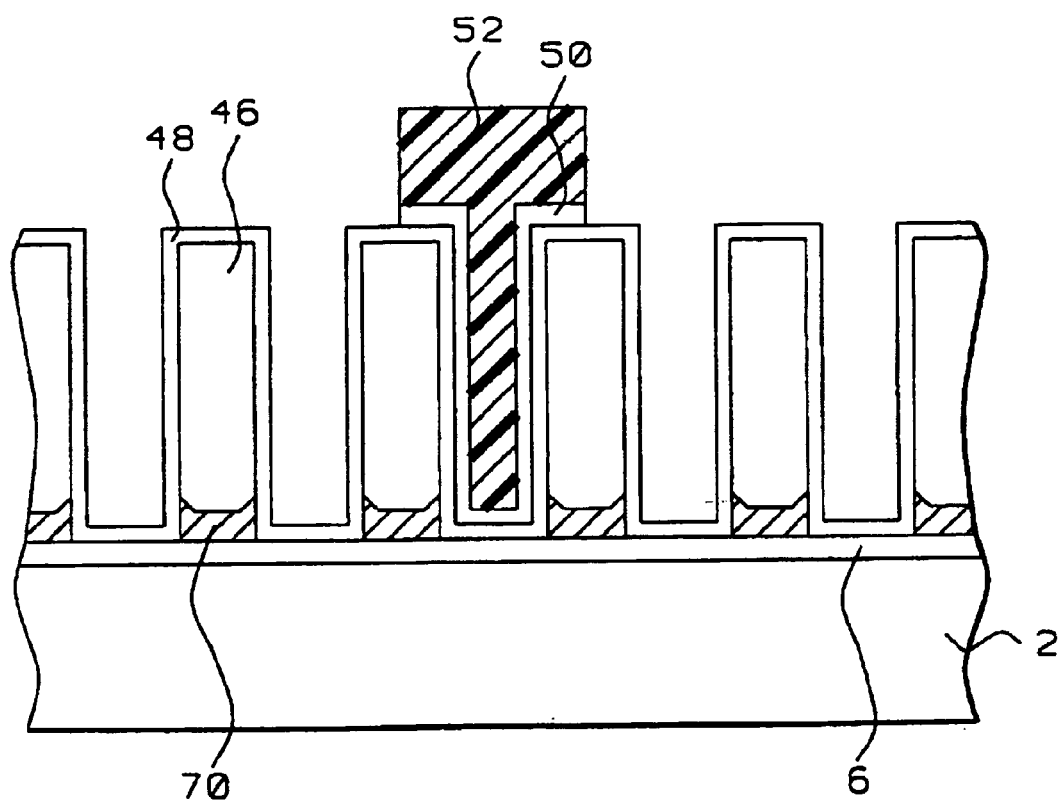
Figure 3D:
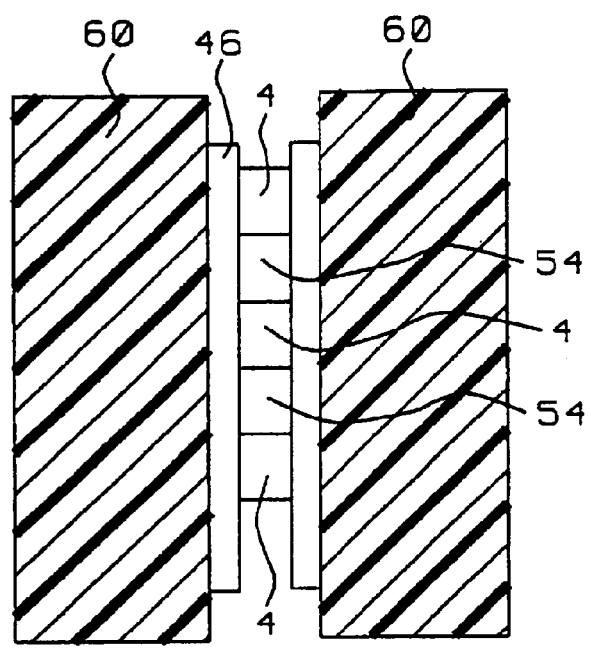
Figure 4D:
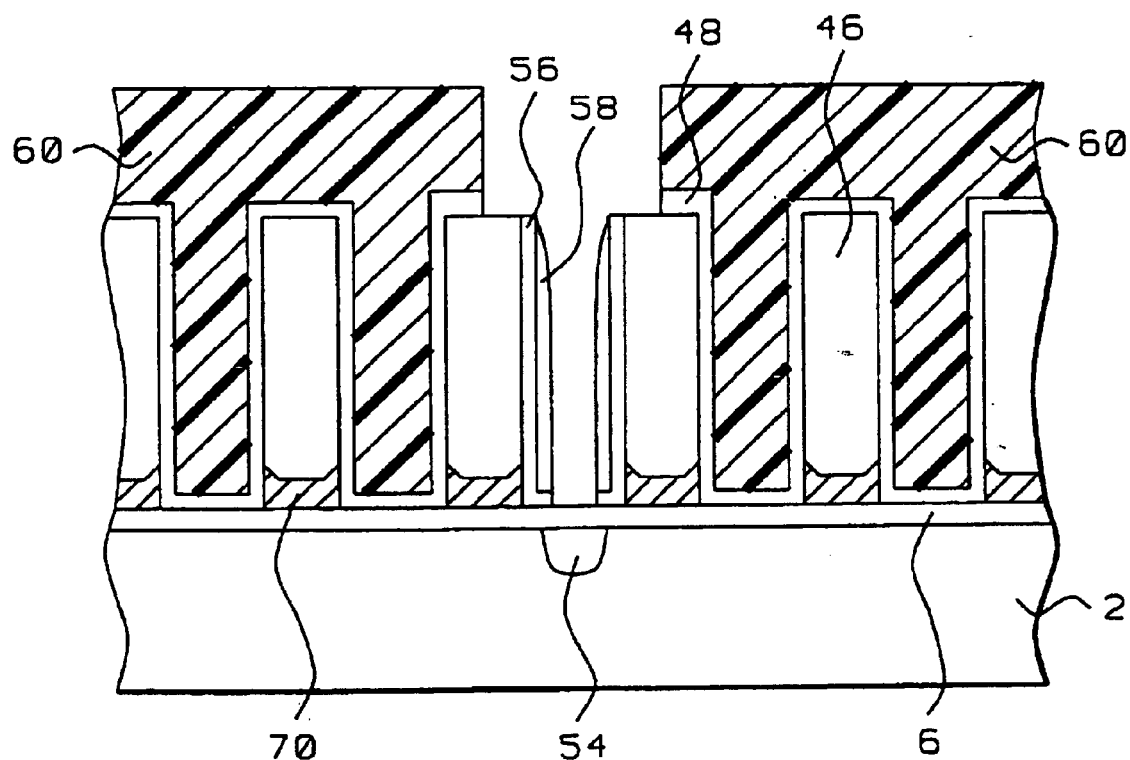
Figure 3E:
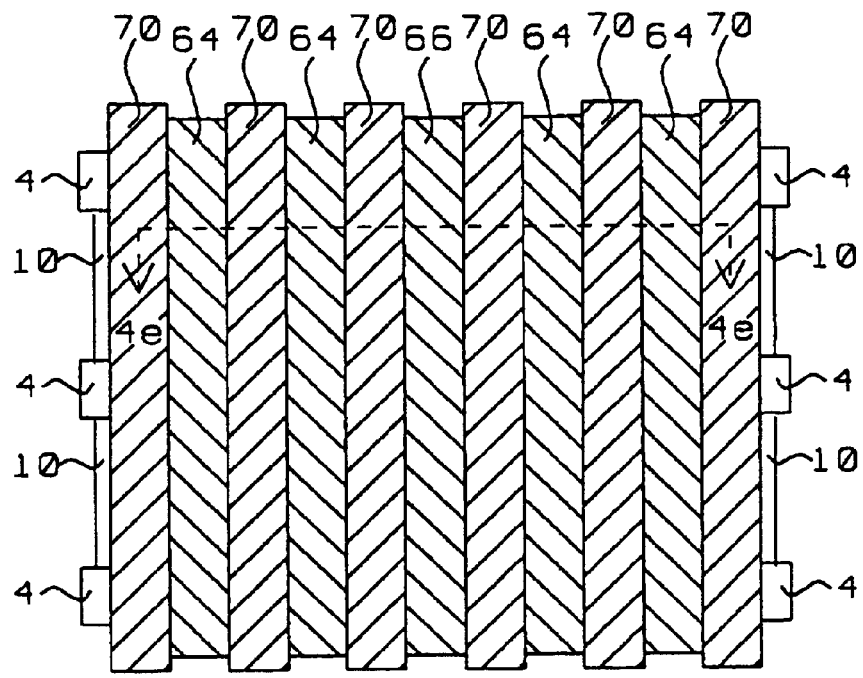
Figure 4E:
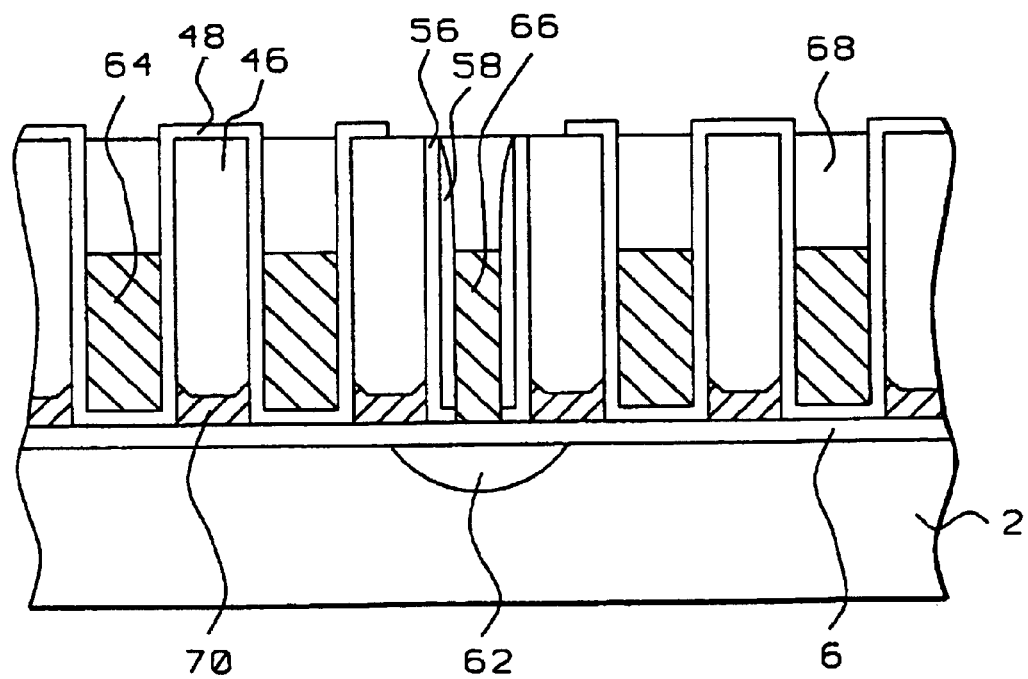
Figure 3F:
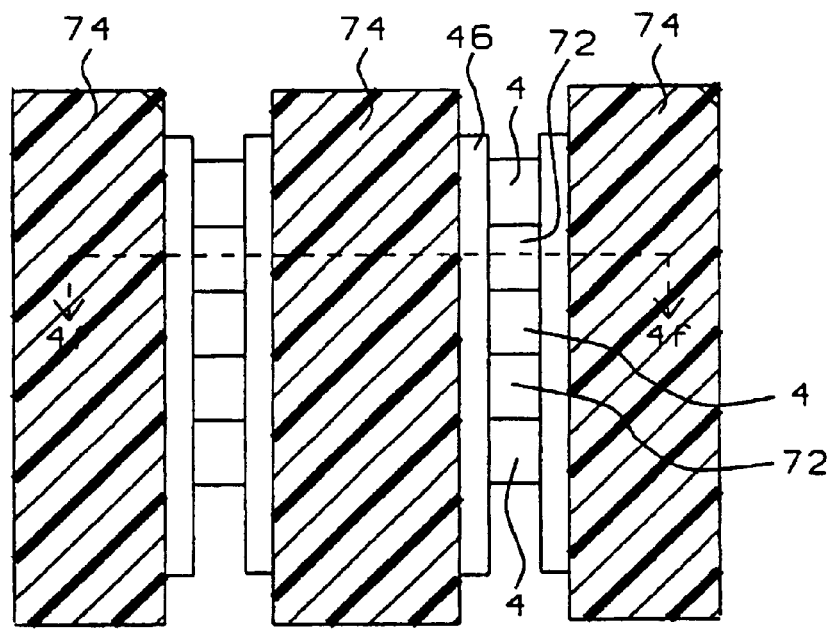
Figure 4F:
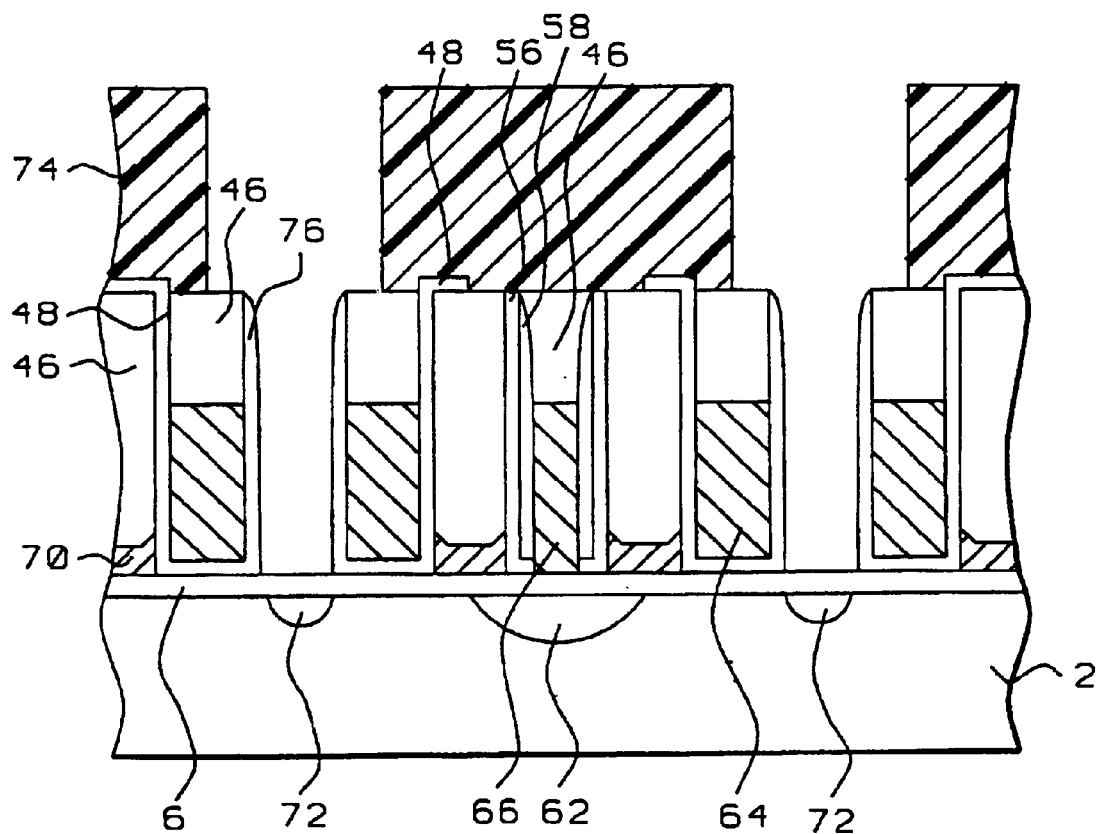
Figure 3G:
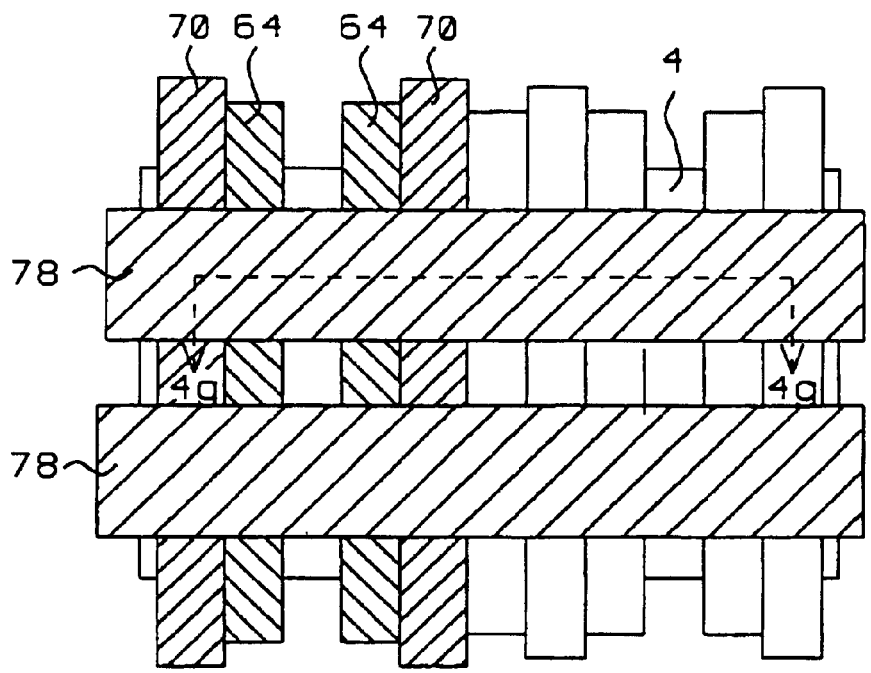
Figure 4G:
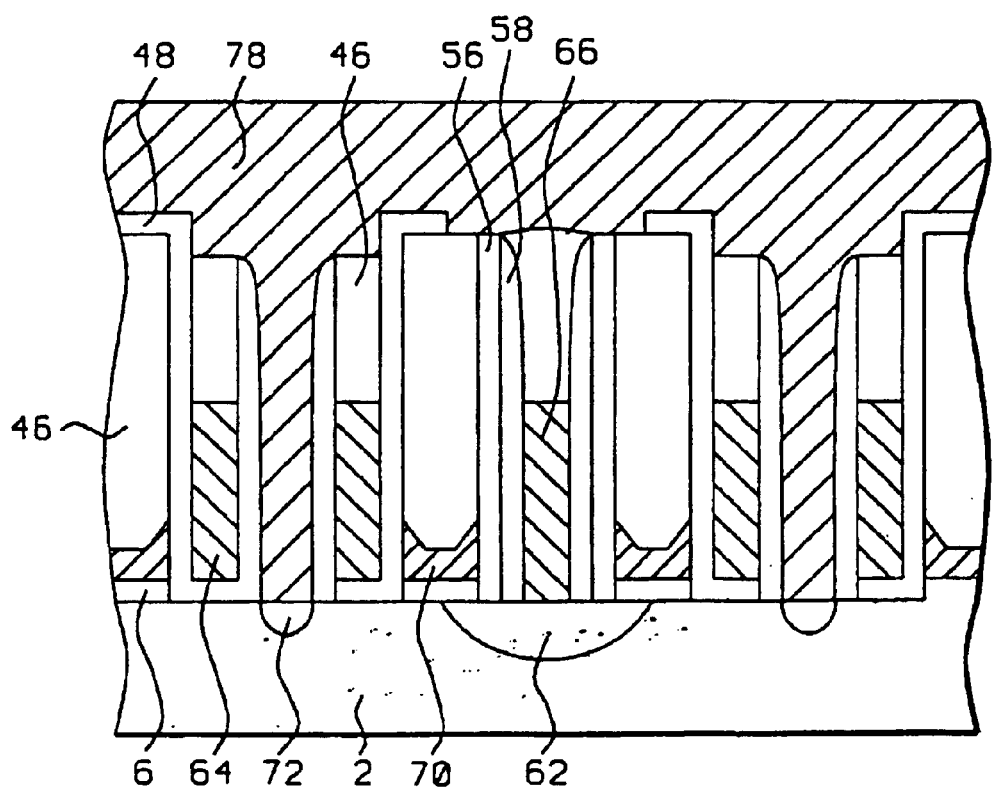
Figure 5:
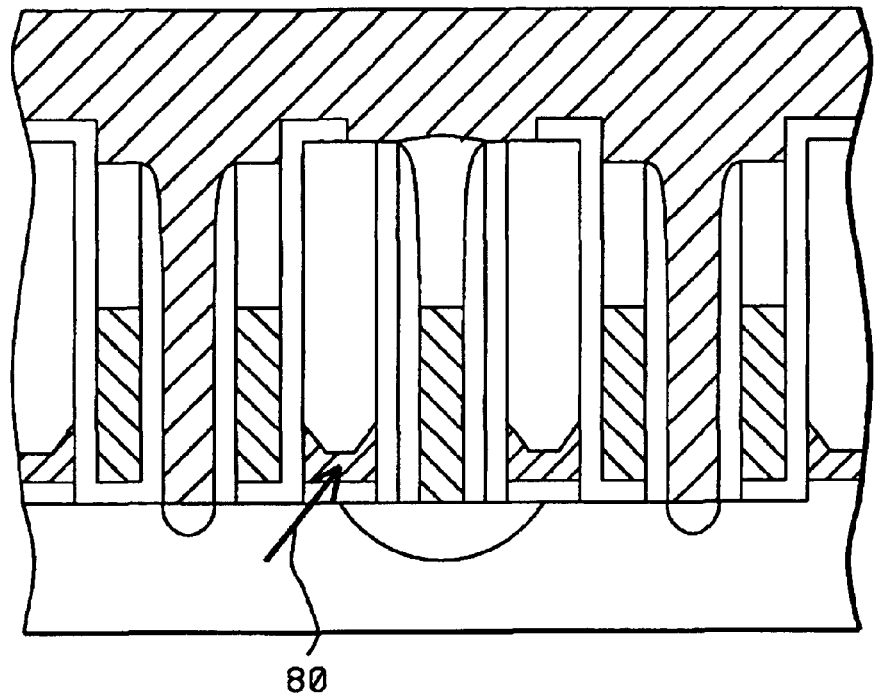
FIG. 5 shows the programming method of a split gate flash memory cell according to the invention.
Figure 6:
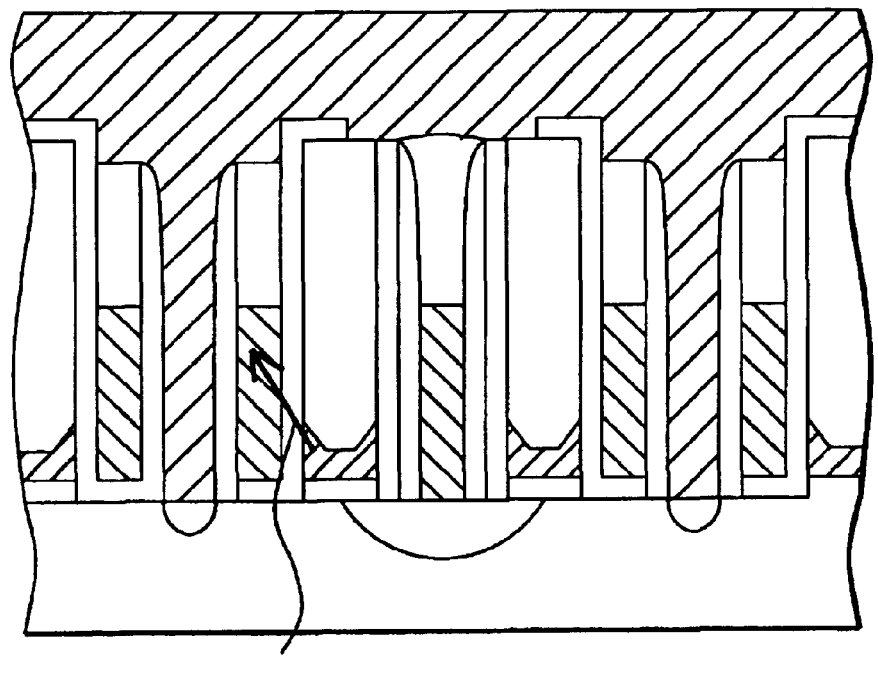
FIG. 6 shows the erasing method of a split gate flash memory cell according to the invention.

Preferred embodiments of the invention are well described with the aid of FIGS. 3a–3g and 4a–4g. A method of fabricating a novel split gate flash memory cell is presented in FIGS. 3a–6g, where top views of the cell are presented at successive stages of the process and in FIGS. 4a–4g, which show the corresponding cross-sections. A floating gate oxide 6, is formed on a semiconductor substrate 2, which preferably is a silicon substrate, to a thickness of about 80 Angstroms, followed by deposition of a doped first polysilicon layer, 8, to a depth of about 800 Angstroms. The first polysilicon layer, and also the subsequent doped polysilicon layers, is phosphorus doped either in situ or by ion implantation to achieve a high conductivity. Active regions, 10, are defined using isolating regions, such as shallow trench isolation regions, 4. This is followed by deposition of a first insulator layer, which preferably is a silicon nitride layer to a depth of about 2500 Angstroms. The first insulator layer is patterned to achieve the shape of region 42, extending in a direction perpendicular to the active regions, which will be denoted, the row direction. A preferred method for obtaining the shape of region 42 is to first form a photoresist layer, 44, as shown in FIGS. 3b and 4b. The photoresist pattern, 44, is used in etching the first insulator layer to achieve the shape of region 42 of FIG. 4b. Preferably, an etch is then performed to achieve the shape of region 8 as shown in FIG. 4b, where the sloped segments of the first conductor layer, to be fashioned to be the floating gates, will provide improved operation of the memory cell Details of the method to fabricate such sharp poly tips are presented in U.S. Pat. No. 6,090,668 to Lin et al., which is herein incorporated by reference. A second insulator layer, preferably an oxide layer is deposited to a thickness of about 3000 Angstroms and a CMP (chemical-mechanical polishing) step is performed so that the second insulating layer is formed into sections, 46, that are over the first conductor layer and intervene with sections of the first insulator layer. A selective etch is now performed to remove the sections of first insulator layer. This requires that good selectivity is possible with respect to the second insulating layer. For the preferred choices of nitride for the first insulating layer and oxide for the second insulator layer, thus is well known to be the case. The first conducting layer and floating gate insulator layer, that were disposed under the section of first insulator layer, are now successively etched. This is followed by the deposition of two insulator layers. A third insulator layer, 48, deposited first, is preferably an oxide layer about 150 Angstroms thick and a fourth insulating layer is preferably a nitride film about 350 Angstroms thick. The fourth insulator layer is patterned to achieve the shape indicated shown as region 50 in FIG. 4c. A preferred procedure to obtain this patterning to a form a photoresist layer, 52, and perform a selective etch of the exposed fourth insulator layer without etching the third insulating layer. It is well known how to achieve this selectivity when preferred materials, oxide for the third insulator and nitride for the fourth insulator layer, are used. At this point the structure is as shown in FIGS. 3c and 4c. The sections containing fourth insulator layers are source sections. Source regions 54 are formed by ion implantation through the sections, which is performed after masking all but the source sections and etching the third and fourth insulator layers to remove these layers from above the semiconductor region, 2, and to form insulator spacers 56 and 58. The masking is preferably accomplished using a patterned photoresist layer, 60. Phosphorus ion implantation is preferred for the source implant, at energy of about 20 keV and to a dose of about 4E14 per cm2. A source implant anneal is performed, at about 900 degrees C., to obtain an enlarged source region, 62. Next a second conductor layer, which preferably is a polysilicon layer, is deposited to a depth of about 3000 Angstroms, and etched back to form wordlines 64, and source pick up lines 66. At this stage of the process, the source regions, 54 are self aligned to the floating gates 70 and the source pick up lines are self aligned to the source regions and to the floating gates.

This is followed by deposition of a fifth insulator layer, preferably a nitride layer to a depth of about 2000 Angstroms, which is then etched back to achieve the fifth insulator sections 68, isolating the word lines 64 and the source pick up lines 66. A masking step is now performed to open the drain areas, 72. This can be accomplished by patterning a photoresist layer, 74, and removing the material from the drain areas, 72, by etching the third insulator layer, 48, the second insulator layer, 46, the first conductor layer, 8, and the floating gate insulator layer. Drain ion implantation is now performed, which preferably is As ion implantation to a dose of about 4E15 pr cm2 at an energy of about 60 keV, forming drain region 80. A sixth insulator layer is then deposited, which preferably is an oxide layer, to a depth of about 500 Angstroms and etched to form insulating spacers, 76. Finally a third conductor layer is deposited, which preferably is a polysilicon layer, to a depth of about 3000 Angstroms and patterned to be drain pick up lines, 78. This patterning can preferably be accomplished using photoresist. The drain pick up lines are bitlines running in the row direction. Thus drain pick tip lines are self aligned to drain regions and both are self aligned to wordlines.

Programming of split gate memory cells according to the invention is by the mechanism of source side injection. Channel electrons are raised in energy and are injected into the floating gates as indicated by the arrow, 80, in FIG. 5, charging the floating gates. The erasing operation, in which the floating gates are discharged, is accomplished by electron tunneling through the sidewall insulator into the adjacent wordline, as indicated by the arrow, 82, in FIG. 6. Sloped floating gates increase the tunneling rate and thus lead to an enhanced efficiency of the erasing operation.

It is a primary objective of the invention to provide a split gate flash cell with self-aligned bit contact to word line, self aligned word line to floating gate and self aligned source line to floating gate. It is also a primary objective of the invention to provide a method of forming a split gate flash cell with self aligned bit contact to word line, self aligned word line to floating gate and self aligned source line to floating gate. Furthermore, it is a primary objective of the invention to provide a structure allowing a reduction in cell areas and further facilitating shrinking of the cell size, resulting in improved performance and packing density. These objectives are well accomplished by the embodiments of the invention.

The memory cells of preferred embodiments of the invention are arranged in the row direction, along the active regions, 10. There are four elements in a cell, drain, wordline, floating gate and source elements, denoted by D, W, F and S respectively, with the drain and source elements each shared by two cells. The order of the elements along this row is . . . DWFSFWDWFSFWDW . . . so that drains have wordlines adjacent on either side and sources have floating gates adjacent on either side. With the active regions having layers appropriate to form floating gate elements, i.e. a gate insulator layer, a conductor layer and an insulator layer, but before sidewall spacers are formed, they can be patterned as . . . YXF*XF*XYXF*XF* . . . , where F* denotes an unfinished floating gate element, X denotes an empty section and Y, which are in the drain positions, is a sacrificial element that can be the same as the floating gate element, except that it is to be removed. This order of the elements is shown in FIG. 4c, however without regions 48, 50 and 52. Source elements are now formed in the empty sections between the floating gate elements. First spacers are formed to insulate the floating gate sidewalls. Ion implantation onto the semiconductor regions between floating gate elements forms source regions self aligned to the adjoining floating gate elements. A conductor layer is deposited and etched back so that the conducting layer is only within the cavities in the "X" positions, and, in the same way, an insulator layer is deposited over the conductor layer and etched back so that it too exists only within the cavities in the "X" positions. Thus, source pick up lines are formed self-aligned to source regions, running in the column direction and contacting to corresponding source regions of all the rows. The same processing steps, conductor layer deposition and etch back and insulator layer deposition and etch back, at the same time form wordline elements self aligned between floating game elements and sacrificial elements. Wordlines also run in the column direction connecting corresponding wordline elements of all the rows. At this stage only the drain elements need to be formed so that the sections along a row are . . . YWFSFWYWFSF . . . and the next step is to eliminate the sacrificial elements. The finished floating gate elements are now denoted F. Masking to expose the sacrificial elements, as in FIG. 4f; and etching, stopping at the surface of the semiconductor region, removes the material of the sacrificial elements. Materials for the word line elements and for the sacrificial elements need to be chosen so that the sacrificial elements can be selectively etched. Spacers are formed to insulate the wordline element sidewalls. Ion implantation onto the semiconductor regions between wordline elements forms drain regions self aligned to the adjoining wordline elements. A conductor layer is deposited contacting the drain regions and patterned to be drain pick up lines. The drain pick up lines are bitlines running in the row direction. Thus drain pick up lines are self aligned to drain regions and both are self aligned to wordlines.

While the invention has been particularly shown and described with reference to the preferred embodiments thereof, it will be understood by those skilled in the art that various changes in form and detail may be made without departing from the spirit and scope of the invention.

What is claimed is:

1. A new method of fabricating a split gate flash memory device with multi-self alignment, comprising:

forming active regions, arranged in rows, disposed over a semiconductor region and separated by isolation regions;

forming structure elements that are arranged in identical order along the rows of active regions, there being at this point three structural elements in the arrangements: unfinished floating gate, sacrificial and empty elements denoted by F*, Y and X respectively, which are arranged as . . . YXF*XF*XYXF*XF* . . . , so that empty elements fall between unfinished floating gate elements on both sides and between unfinished floating gate and sacrificial elements, sacrificial elements being the same in structure as unfinished floating gate elements except that they are to be removed, and where unfinished floating gate elements and sacrificial elements are created by forming a gate insulator layer over said semiconductor region and patterning said gate insulator layer to exist only in unfinished floating and sacrificial element areas, forming floating gates conductive layers that are disposed over said gate insulator layer, and forming a floating gate insulator layer by depositing and patterning an insulator layer into parallel strips perpendicular to the row direction, so that the strips are disposed over corresponding unfinished floating gate elements and sacrificial elements;

forming first a blanket conformal insulator layer and then a second conformal insulator layer within those empty elements that are between unfinished floating gate elements and extending over a portion of the adjacent unfinished floating gate elements and, and performing spacer etching procedures on that portion of the blanket conformal layer that is within those empty elements that are between unfinished floating gate elements and extending care portion of the adjacent unfinished floating gate elements and on the second conformal insulator layer to form insulating spacers, which finish es the floating gate elements;

performing a source ion implantation through the empty elements that are between floating gate elements and annealing to form source regions that are between floating gate elements and annealing to form source regions that are self aligned to adjacent floating gate elements and extend within said semiconductor region to under the adjoining floating gate regions;

forming conductive source pick up lines, in those empty element that are between floating gale elements so that they are self aligned to the adjacent floating gate elements and to the source regions, and conductive wordlines, in those empty elements that are between floating gate elements and sacrificial elements so that they are self aligned to the adjacent floating gate elements and adjacent sacrificial elements, by depositing a conductive layer and etching back so that the remaining conductive layer is well within what where the empty elements, and then forming a source element and wordline element insulator layer to substantially fill what were the empty elements, which completes the formation of source elements between the floating gate elements, produces unfinished word line elements;

removing the sacrificial elements to the surface of said semiconductor regions;

forming word line element sidewall insulating spacers over the bare sidewalls of the unfinished word line elements, which finishes the word line elements;

performing drain ion implantation through the new empty elements that are between word line elements to form drain regions that are self aligned to adjacent word line elements;

forming drain pick up lines, containing drain contact regions contacting the drains that are self aligned to the drains and to the adjacent word line elements and drain lines contacting all drain contact regions of the same row.

2. The method of claim 1 wherein said floating gate insulator layer is a grown oxide layer of thickness about 80 Angstroms.

3. The method of claim 1 wherein said floating gate is a conductive layer composed of doped polysilicon that is about 800 Angstroms thick.

4. The method of claim 1 wherein said floating gate insulator layer is composed of oxide and is about 3000 Angstroms thick.

5. The method of claim 1 wherein said blanket conformal insulator layer is an oxide layer of thickness about 150 Angstroms.

6. The method of claim 1 wherein said second insulator layer is a nitride layer of thickness about 350 Angstroms.

7. The method of claim 1 wherein said source ion implantation is a P ion implantation of energy about 15 keV to a dose of about 4E14 per cm2.

8. The method of claim 1 wherein said conductive source pick up lines and wordlines are composed of doped polysilicon.

9. The method of claim 1 wherein said source element and wordline element insulator layer is a nitride layer.

10. The method of claim 1 wherein said wordline element sidewall spacers are composed of oxide.

11. The method of claim 1 wherein said drain ion implantation is an As ion implantation of energy about 60 keV to a dose of about 4E 15 per cm2.

12. The method of claim 1 wherein said drain pick up lines are composed of doped polysilicon.

13. The new method of fabricating a split gate flash memory device with multi-self-alignment having sharply tipped floating gates for efficient erasing, comprising:

forming active regions, arranged in rows, disposed over a semiconductor region and separated by isolation regions, the active regions having had formed a gate insulating layer disposed over said semiconductor region and a first conductor layer disposed over said gate insulating layer;

depositing a first insulator layer and patterning said first insulator layer into parallel strips disposed over said first conductor layer and running perpendicular to said rows;

etching said first conductor layer to achieve a sloping top profile;

depositing a floating gate insulator layer and performing CMP so that said floating gate insulator layer forms strips just filling the space between said strips of first insulator layer, removing successively, said strips of first insulator layer, said first conductor layer and said gate insulator layer from between said strips of floating gate insulator layer, and thus forming conductive floating gate layers having sharp edges for improving erasing efficiency, and thus forming structural elements that are referred to as unfinished floating gate elements arid sacrificial elements that are denoted F* and Y respectively, and which are identical except sacrificial elements are to be removed, and empty clams arc denoted by X, and these structural elements are arranged in identical order along the rows of said active regions, as . . . YXF*XF*XYXF*XF* . . . , so that empty elements fall between unfinished floating gate elements. On both sides and between unfinished floating we and sacrificial elements, sacrificial elements being the same mc in structure as unfinished floating gate elements except that they are to be removed, and where unfinished floating gate elements and sacrificial elements are created by forming a gate insulator layer over said semiconductor region and patterning said gate insulator layer to exist only in unfinished floating and sacrificial element areas, forming floating gates conductive layers that are disposed over said gate insulator layer, and forming a floating gate insulator layer by depositing and patterning an insulator layer into parallel strips perpendicular to the row direction, so that the strips are disposed over corresponding unfinished floating gate elements and sacrificial elements;

forming first a blanket conformal insulator layer and then a second conformal insulator layer within those empty elements that are between unfinished floating gate elements and extending over a portion of the adjacent unfinished floating gate elements and, and performing spaceer etching procedures on that portion of the blanket conformal layer that is within those empty elements that are between unfinished floating gate elements and extending over a portion of the adjacent unfinished floating gate elements and on the second conformal insulator layer to form insulating spacers, which finishes the floating gate elements;

performing a source ion implantation through the empty elements that are between floating gate elements and annealing to form source regions that are between floating gate elements and annealing to form source regions that are self aligned to adjacent floating gate elements and extend within said semiconductor region to under the adjoining floating gate regions;

forming conductive source pick up lines, in those empty element that are between floating gale elements so that they are self aligned to the adjacent floating gate elements and to the source regions, and conductive wordlines, in those empty elements that are between floating gate elements and sacrificial elements so that they are self aligned to the adjacent floating gate elements and adjacent sacrificial elements, by depositing a conductive layer and etching back so that the remaining conductive layer is well within what were the empty elements, and then forming a source element and wordline element insulator layer to substantially fill what were the empty elements, which completes the formation of source elements between the floating gate elements, produces unfinished word line elements;

removing the sacrificial elements to the surface of said semiconductor region;

forming word line element sidewall insulating spacers over the bare sidewalls of the unfinished word line elements, which finishes the word line elements;

performing drain ion implantation through the now empty elements that are between word line elements to form drain regions that are self aligned to adjacent word line elements;

forming drain pick up lines, containing drain contact regions contacting the drains that are self aligned to the drains and to the adjacent word line elements and drain lines contacting all drain contact regions of the same row.

14. The method of claim 13 wherein said first insulator layer is a nitride layer about 2500 Angstroms thick.

15. The method of claim 13 wherein said first conductor layer, is a doped polysilicon layer about 800 Angstroms thick.

16. The method of claim 13 wherein said floating gate insulator layer is grown oxide layer of thickness about 80 Angstroms.

17. The method of claim 13 wherein said floating gate is a conductive layer composed of doped polysilicon that is about 800 Angstroms thick.

18. The method of claim 13 wherein said floating gate insulator layer is composed of oxide and is about 3000 Angstroms thick.

19. The method of claim 13 wherein said blanket conformal insulator layer is an oxide layer of thickness about 150 Angstroms.

20. The method of claim 13 wherein said second insulator layer is a nitride layer of thickness about 350 Angstroms.

21. The method of claim 12 wherein said source ion implantation is a P ion implantation of energy about 15 keV to a dose of about 4E14 per cm2.

22. The method of claim 13 wherein said conductive source pick up lines and wordlines are composed of doped polysilicon.

23. The method of claim 13 wherein said source element and wordline element insulator layer is a nitride layer.

24. The method of claim 13 wherein said wordline element sidewall spacers are composed of oxide.

25. The method of claim 13 wherein said drain ion implantation is an As ion implantation of energy about 60 keV to a dose of about 4E 15 per cm2.

26. The method of claim 13 wherein said drain pick up lines are composed of doped polysilicon.

* * * * *